(12) United States Patent
Maireanu (10) Patent No.: US 7,531,989 B2
(45) Date of Patent: May 12, 2009

(54) BATTERY FUEL GAUGE CIRCUIT

(75) Inventor: Stefan Maireanu, Sunnyvale, CA (US)

(73) Assignee: 02Micro International Ltd., Georgetown (KY)

(*) Notice: Subject to any disclaimer, the term of this patent is extended or adjusted under 35 U.S.C. 154(b) by 381 days.

(21) Appl. No.: 11/430,442

(22) Filed: May 9, 2006

(65) Prior Publication Data

US 2007/0096697 A1   May 3, 2007

Related U.S. Application Data

(60) Provisional application No. 60/732,560, filed on Nov. 2, 2005.

(51) Int. Cl.
*H02J 7/16* (2006.01)

(52) U.S. Cl. ............... 320/150; 320/132; 320/136; 320/149; 324/427; 324/431

(58) Field of Classification Search ............ 320/150, 320/152, 132, 134, 136, 153; 324/432, 434
See application file for complete search history.

(56) References Cited

U.S. PATENT DOCUMENTS

| | | | | |
|---|---|---|---|---|
| 4,406,429 A * | 9/1983 | Allen | ............... | 244/3.11 |
| 4,587,576 A * | 5/1986 | Hirota et al. | ............... | 386/93 |
| 5,200,689 A * | 4/1993 | Interiano et al. | ............... | 320/149 |
| 5,315,228 A | 5/1994 | Hess et al. | | |
| 5,721,482 A * | 2/1998 | Benvegar et al. | ............... | 320/106 |
| 6,154,012 A | 11/2000 | Drori | | |
| 2004/0056868 A1 * | 3/2004 | Kato | ............... | 345/600 |
| 2006/0164408 A1 * | 7/2006 | Nishikawa et al. | ............... | 345/207 |

OTHER PUBLICATIONS

National Semiconductor—Characteristics of Rechargeable Batteries National Semiconductor-Battery Charging, (Internet Article), 18 pgs., http://rcbatteryclinic.com/seminar.htm.
Panasonic-Nickel Cadmium Batteries Technical Handbook, (Internet Article), 1998/99, 95 pgs., http://www.batteryuniversoty.com index.htm.
National Semiconductor—Characteristics of Rechargeable Batteries National Semiconductor-Battery Charging, (Internet Article), 18 pgs., http://rcbatteryclinic.com/seminar.htm, Jul. 27, 1996.
Panasonic-Nickel Cadium Batteries Technical Handbook, (Internet Article), 1998/99, 95 pgs., http://www.batertuniversity.com/index.htm.

* cited by examiner

*Primary Examiner*—Akm E Ullah
*Assistant Examiner*—Arun Williams
(74) *Attorney, Agent, or Firm*—Wang Law Firm; Li K. Wang (57) ABSTRACT

The present invention is a battery fuel gauge circuit for measuring the capacity of a battery pack. The battery fuel gauge circuit includes an amplifier circuit, a correction circuit, a plurality of comparators, and a multiplexer. The amplifier circuit can sense a discharge current flowing through a sense resistor and a variable temperature from the battery pack and generate a first and a second voltage signals, which are corrected by the correction circuit and compared with a reference voltage by the plurality of comparators. After correction and comparison, the multiplexer can transmit the compared signals to an external indicating circuit that controls the display of the capacity of the battery pack.

17 Claims, 4 Drawing Sheets

BATTERY FUEL GAUGE CIRCUIT

RELATED APPLICATION

This application claims the benefit of U.S. provisional application, titled Integrated Parametric Battery Fuel Gauge Meter, Ser. No. 60/732,560, filed on Nov. 2, 2005, the specification of which is incorporated herein in its entirety by this reference.

BACKGROUND OF THE INVENTION

1. Field of the Invention

The present invention relates to rechargeable batteries and in particular to a battery fuel gauge circuit for detecting the capacity of the rechargeable batteries.

2. Description of the Related Art

Currently, portable electronic appliances are becoming more and more common in today's society as the capabilities and uses of such appliances continue to expand. The portable electronic appliances may include, by way of example, laptop computers, cell phones, personal digital assistants (PDAs), pagers, camcorders, digital cameras and other devices. Many portable electronic appliances are powered by rechargeable batteries, i.e., secondary batteries that sometimes can form a rechargeable battery pack. Such rechargeable batteries can include alkaline batteries such as well-known nickel cadmium (Ni—Cd) or nickel metal hydride (Ni-MH) batteries. Recently, lithium ion (Li-ion) batteries have gained more popularity in some high-end portable electronic appliances because they exhibit high energy density, low temperature characteristics, and stable storage capability.

The rechargeable battery pack often includes circuit boards, electronic circuitry, mechanical assemblies and electromechanical protection components. The rechargeable battery pack usually requires an electronic charger for recharging the depleted batteries. The electronic charger may start, ramp, taper or stop the charging current to the rechargeable battery pack and measure its temperature, just to name a few of the functions. Simply speaking, the battery pack is a complex system of components working in harmony to safely deliver power to any type of the above-mentioned portable electronic appliances.

In usage, one of the most common concerns about the rechargeable battery pack is to determine how many "charges" are left in the battery pack, that is, the remaining capacity of the battery pack. In order to determine the capacity of the battery pack, some prior art solutions utilize numerous components and different algorithms, and are costly to be manufactured although higher accuracy of the prediction of the battery pack can be achieved by these solutions. These solutions usually rely on software and analog-to-digital converters (ADCs) that increase the cost and complexity of the portable electronic appliances. As a result, these solutions will be not worth for some small and low cost applications.

Some cheaper solutions with fewer components can be used to predict the remaining capacity of the rechargeable battery pack. The usual drawback of these solutions is that they have low accuracy, low efficiency or bad performance. With these solutions, it is difficult to accurately predict the remaining capacity of the rechargeable batteries.

It is thus desirous to have an apparatus that can provide accurate prediction of the remaining capacity of the rechargeable battery pack without adding complexity and unnecessary cost to the apparatus, and it is to such apparatus the present invention is primarily directed.

BRIEF SUMMARY OF THE INVENTION

In one embodiment, the invention is a battery fuel gauge circuit for measuring a capacity of a rechargeable battery pack. The battery pack is capable of generating a battery voltage and a discharge current. The battery pack has a temperature. The battery gauge circuit includes am amplifier circuit, a correction circuit, a plurality of comparators, and a multiplexer. The amplifier circuit is capable of sensing the discharge current and the temperature of the battery pack and generating a first and a second voltage signals based upon the discharge current and the temperature. The correction circuit is capable of correcting the first and the second voltage signals and generating a plurality of voltages. The plurality of comparators is capable of receiving a reference voltage based upon the battery voltage from the battery pack. The plurality of comparator compares the reference voltage with the plurality of voltages from the correction circuit and generates a plurality of digital signals. The multiplexer is capable of receiving the plurality of digital signals from the plurality of comparators, and controlling an external indicating circuit to indicate the capacity of the battery pack based upon the plurality of digital signals.

In yet another embodiment, the invention is an integrated circuit for measuring a battery capacity. The integrated circuit includes a battery pack, a resistor, a charger, an amplifier circuit, a correction circuit, a plurality of comparators, and a multiplexer. The battery pack is capable of generating a discharge current and a battery voltage. The battery pack has a temperature. The discharge current flows through the resistor. The amplifier circuit is capable of sensing the discharge current and the temperature of the battery pack and generating two voltage signals based upon the discharge current and the temperature. The correction circuit is capable of correcting the two voltage signals from the amplifier circuit and generating a plurality of voltages. The plurality of comparators receives a reference voltage based upon the battery voltage from the battery pack, compares the reference voltage with the plurality of voltages from the correction circuit and generating a plurality of digital signals. The multiplexer is capable of receiving the plurality of digital signals from the plurality of comparators, and controlling an external indicating circuit representative of the battery fuel gauge of the battery pack based upon the plurality of digital signals.

In yet another embodiment, the invention is a portable computer. The portable computer includes an input device for taking inputs from a user, a microcontroller for performing operations based on the inputs from the user, a power supply for supplying power to the portable computer, and a battery fuel gauge circuit for measuring a remaining capacity of the power supply. The battery fuel gauge circuit includes a battery pack, a resistor, a charger, an amplifier circuit, a correction circuit, a plurality of comparators, and a multiplexer. The battery pack is capable of generating a discharge current and a battery voltage. The battery pack has a temperature. The discharge current flow through the resistor. The charger is capable of charging the battery pack through the resistor. The amplifier circuit is capable of sensing the discharge current and the temperature of the battery pack and generating two voltage signals based upon the discharge current and the temperature. The correction circuit is capable of correcting the two voltage signals from the amplifier circuit and generating a plurality of voltages. The plurality of comparators receives a reference voltage based upon the battery voltage and compares the reference voltage with the plurality of voltages from the correction circuit and generating a plurality of digital signals. The multiplexer is capable of receiving the plurality of digital signals from the plurality of comparators, and controlling an external indicating circuit representative of the battery fuel gauge of the battery pack based upon the plurality of digital signals.

In yet another embodiment, the invention is a method for measuring a capacity of a battery pack. The method includes the steps of receiving a battery voltage from the battery pack, generating a sense voltage based upon the battery voltage, generating a voltage indicative of a temperature of the battery pack, correcting the send voltage and the voltage indicative of the temperature of the battery pack, generating a plurality of threshold voltages through the correction, comparing the plurality of threshold voltages with a reference voltage, generating a plurality of control signals through the comparison, and controlling an external indicating circuit to display the capacity of the battery pack. The reference voltage is based upon the battery voltage.

BRIEF DESCRIPTION OF THE DRAWINGS

Advantages of the present invention will be apparent from the following detailed description of exemplary embodiments thereof, which description should be considered in conjunction with the accompanying drawings, in which.

DETAILED DESCRIPTION OF THE INVENTION

Figure 1:
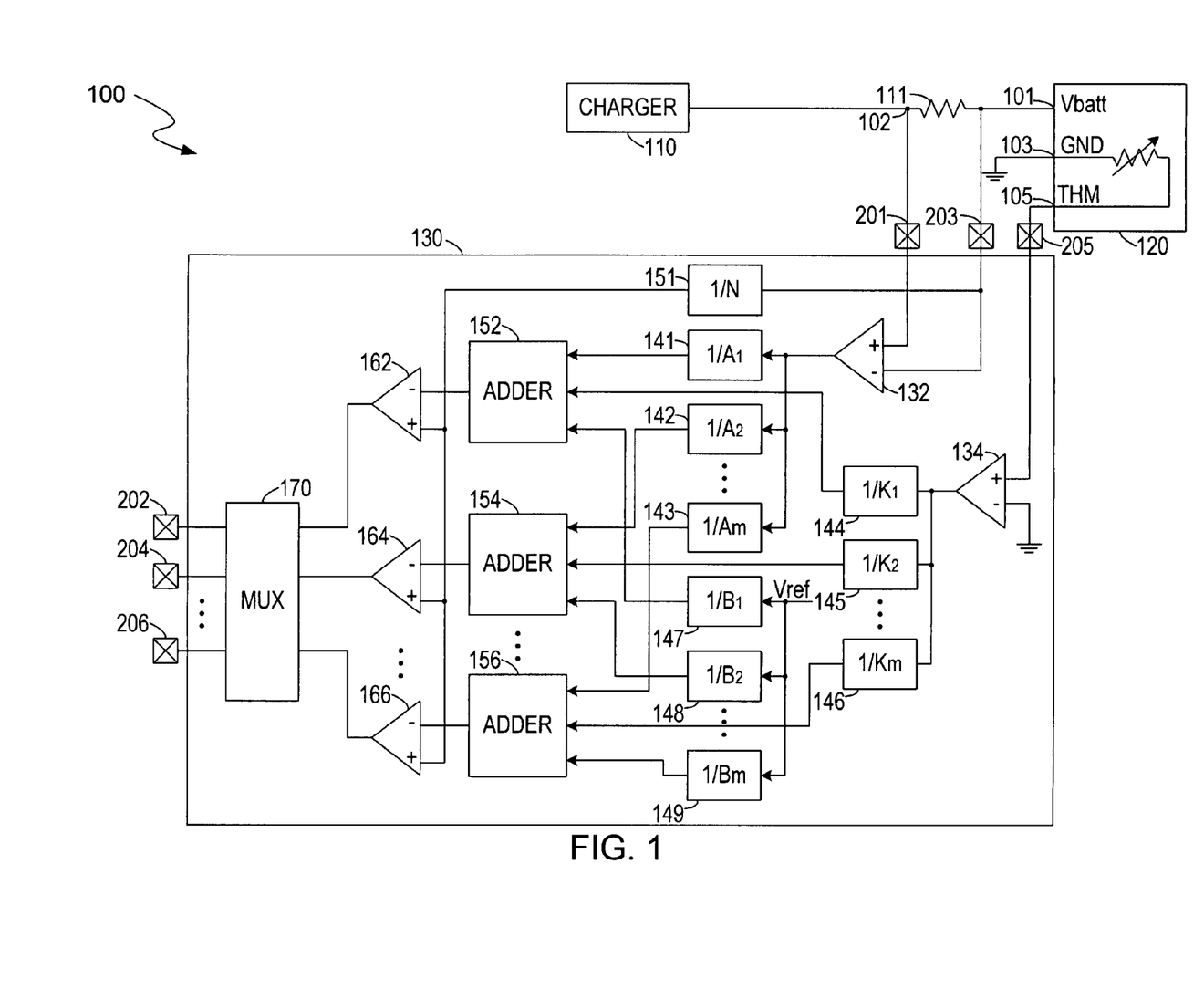
FIG. 1 is a simplified block diagram of an exemplary battery fuel gauge device consistent with the invention.

Briefly described, the invention provides a correction circuit to a battery fuel gauge circuit, so that the battery fuel gauge circuit can detect the amount of energy (the remaining charges) stored in a rechargeable battery cell or a rechargeable battery pack without adding the complexity or lowering the accuracy of the battery fuel gauge circuit. FIG. 1 illustrates a simplified block diagram of an exemplary battery fuel gauge device 100. The battery fuel gauge device 100 includes a charger 110, a rechargeable battery pack 120, and a battery fuel gauge circuit 130. The battery fuel gauge device 100 can generate an appropriate operating voltage to source an external application system at node 102 based upon the remaining energy in the battery pack 120. In this embodiment, the battery fuel gauge circuit 130 is utilized to detect the amount of the remaining energy in the battery pack 120. Furthermore, the battery fuel gauge circuit 130 can implement discharge current correction and battery temperature correction to signals from the battery pack 120 in order to predict the remaining capacity of the battery pack 120 accurately.

The charger 110 can charge the battery pack 120 so that the battery pack 120 can have sufficient power to source the external application system. The sense resistor 120 can measure the charge current. Although the charger 110 is external to the battery pack 120 as shown in FIG. 1, it can also be incorporated into the battery pack 120.

The rechargeable battery pack 120 consists of a plurality of rechargeable battery cells coupled in serial or in parallel. The battery pack 120 has three pins 101, 103, and 105. Pin 101 is coupled to a sense resistor 111, and can output a discharge current flowing through the sense resistor 111 based upon a battery voltage of the battery pack 120. When the battery pack 120 operates in a discharge mode after being charged, the battery voltage at pin 101 can continue to decrease to a smaller value. Pin 103 is coupled to the ground. Since the temperature of the battery pack 120 may vary during charging or discharging, an internal battery thermistor is included in the battery pack 120 to measure the variable temperature of the plurality of rechargeable battery cells. The battery pack 120 can generate a voltage signal based upon the temperature measurement. Consequently, pin 105 can output the voltage signal reflecting the thermal features of the plurality of the rechargeable battery cells.

The battery fuel gauge circuit 130 has three input pins 201, 203, and 205, and three output pins 202, 204, and 206. Pin 201 and pin 203 respectively are coupled to two ends of the resistor 111. The battery fuel gauge circuit 130 can receive a voltage differential between pins 201 and 203. The voltage differential is equal to the discharge current multiplied by the resistance of the resistor 111. Since pin 205 is directly connected to pin 105 of the battery pack 120, it can receive a voltage signal reflective of the variable temperature measured by the battery thermistor within the battery pack 120.

The battery fuel gauge circuit 130 includes a current sense amplifier (CSA) 132, a temperature amplifier (TA) 134, a correction unit, a plurality of comparators 162, 164, and 166, and a multiplexer 170. The CSA 132 can monitor the voltage across the resistor 111 and then output an amplified voltage. In other words, the CSA 132 can sense the discharge current flowing through the resistor 111 since the voltage across the resistor 111 is partly determined by the discharge current. The TA 134 can monitor the voltage signal from pin 105 and generate an amplified voltage based upon the thermal features of the battery pack 120. Consequently, the CSA 132 and the TA 134 can serve as an amplifier circuit to amplify the voltage across the resistor 111 and the voltage signal from pin 105.

The correction circuit is composed of three groups of coefficient generators, for example, a first group composed of coefficient generators 141, 142, and 143, a second group consisting of coefficient generators 144, 145, and 146, and a third group including coefficient generators 147, 148, and 149. The correction circuit also includes a plurality of adders, e.g., 152, 154, and 156. In operation, the coefficient generators can provide various coefficients to satisfy the requirements from different users. The various coefficients can correct the errors or variance in the signals from the battery pack 120. The plurality of coefficient generators shown in FIG. 1 are only for illustrative purpose. The number of the coefficient generators can be changed according to different requirements from their corresponding applications.

After receiving the amplified voltage from the CSA 132, the first group of coefficient generators can multiply the amplified voltage by a first group of coefficients, and then deliver the corrected voltages to the plurality of adders 152, 154, and 156, respectively as their first input signals. The second group of coefficient generators can receive the amplified voltage from the TA 134, multiply the amplified voltage by the second group of coefficients, and then generate the corrected voltages to the plurality of adders 152, 154, and 156 as their second input signals. The third group of coefficient generators can receive a reference voltage generated internally by the battery fuel gauge circuit 130. The third group of coefficient generators then multiply the reference voltage by a second group of coefficients, and then output the corrected reference voltages to the plurality of adders 152, 154, and 156 as their third input signals.

Consequently, the adder 152 can receive the corrected voltage from the coefficient generator 141, the corrected voltage from the coefficient generator 144, and the corrected reference voltage from the coefficient generator 147. The adder 152 can combine the three voltages described above and output a sum to a non-inverting input terminal of the comparator 162. The sum is a threshold voltage for the comparator 162. Since the function of other adders, for example, the adder 154 and the adder 156 is similar to that of the adder 152, the relative description will be omitted herein for clarity. The adder 154 can generate a sum to be delivered to the comparator 164, and the adder 156 can output a sum to the comparator 166.

The correction unit further includes a coefficient generator 151. The coefficient generator 151 can provide a coefficient equal to one divided by the total number of the battery cells in the battery pack 120. This coefficient can be multiplied by the battery voltage of the battery pack 120 so that the battery voltage can be corrected. The corrected battery voltage can be sent to inverting terminals of the plurality of comparators 162, 164, and 166. The plurality of comparators 162, 164 and 166 then respectively compare the divided value from the coefficient generator 151 with the threshold voltages from the plurality of adders 152, 154, and 156, and output a plurality of digital signals to the multiplexer 170. For the comparator 162, when the threshold voltage at its non-inverting input terminal is below the divided value at its inverting input terminal, the output of the comparator 162 will be zero ('0'). If the threshold voltage is greater than the divided value, the output of the comparator will be set to one ('1'). Those skilled in the art will appreciate that other comparators have the similar function and performance as the comparator 162, therefore, the similar description of other comparators will be omitted herein for more clarity.

The multiplexer 170 can transmit the plurality of digital signals to an external indicating circuit to display the remaining capacity of the battery pack 120 through the output pins 202, 204, and 206. Those skilled in the art will appreciate that the indicating circuit can be implemented by any possible hardware, software or the combination. For example, the configuration of the indicating circuit can be implemented by LEDs or a microcontroller of a host system.

Although the battery fuel gauge circuit 130 is shown external to the battery pack 120, it is appreciated by those skilled in the art that the battery fuel gauge circuit 130 can also be integrated into the battery pack 120. In other words, the battery fuel gauge circuit 130 and the battery pack 120 can be integrated into one dedicated integrated circuit (IC). It is also appreciated by those skilled in the art that the battery fuel gauge circuit 130 can also be combined and/or incorporated into one dedicated IC together with the charger 110 and the battery pack 120. In addition, the numbers of the input pins and the output pins of the battery fuel gauge circuit 130 are not fixed and they can vary according to the number of the threshold voltages.

Figure 2:
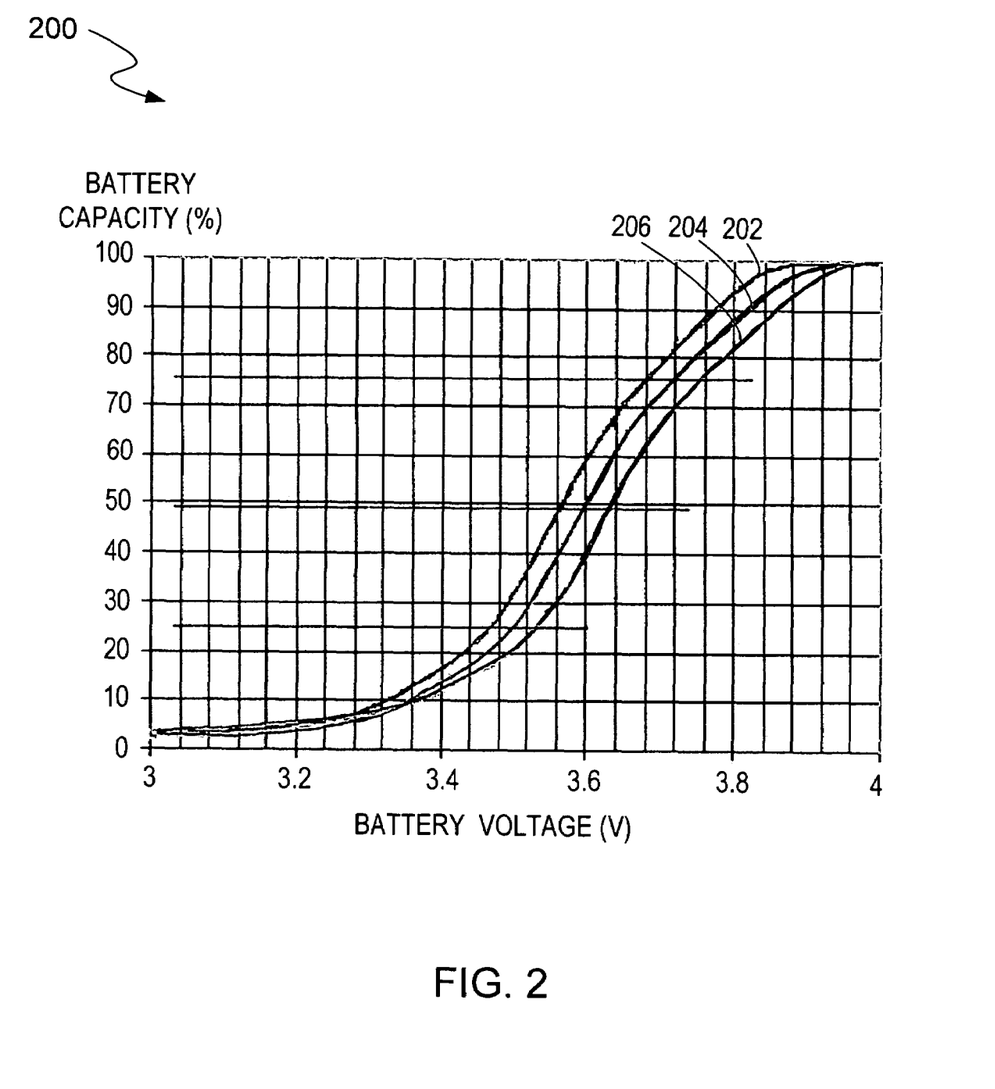
FIG. 2 is a schematic diagram of an exemplary relationship between the battery capacity and the battery voltage of the battery fuel gauge device in FIG. 1 consistent with the invention.

FIG. 2 is a schematic diagram of exemplary relationship between the battery capacity and the battery voltage of the battery fuel gauge device 100 in FIG. 1. In FIG. 2, one battery discharge cycle is shown only for illustrative purpose. When the battery pack 120 operates in the discharge mode with different output power, the battery voltage at pin 101 will decrease, for example, from 4 volts to 3 volts. Plots 202, 204, and 206 respectively show the relationship between the battery capacity and the battery voltage when the output power of the battery pack 120 is 12.5 watts, 10 watts, or 7.5 watts.

When the battery pack 120 generates a constant output power, for example, 12 watts, the battery voltage can decrease as the battery capacity decreases at different discharge currents. If the battery pack 120 has a fixed battery capacity and different discharge currents, it will generate different battery voltages that depend upon the battery capacity, the discharge current, and resistance of internal serial resistors included in the battery pack 120.

As mentioned above, the battery voltage is converted to a reference voltage (i.e., a corrected voltage) by the coefficient generator 151, and then supplied to the plurality of comparators 162, 164, and 166. When the discharge current is fixed, the amplifier 132 can sense the discharge current flowing through the resistor 111. The discharge current, accordingly, can be converted to the plurality of threshold voltages after being sensed by the amplified 132 and then being corrected by the correction circuit. The reference voltage from the coefficient generator 151 is compared with the plurality of threshold voltages so that the external indicating circuit can predict the remaining charges, i.e., the battery capacity of the battery pack 120. Consequently, the plurality of threshold voltages correspond to a certain battery capacity for a certain discharge current. Hence, the plurality of threshold voltages can be adjusted by the discharge current.

Figure 3:
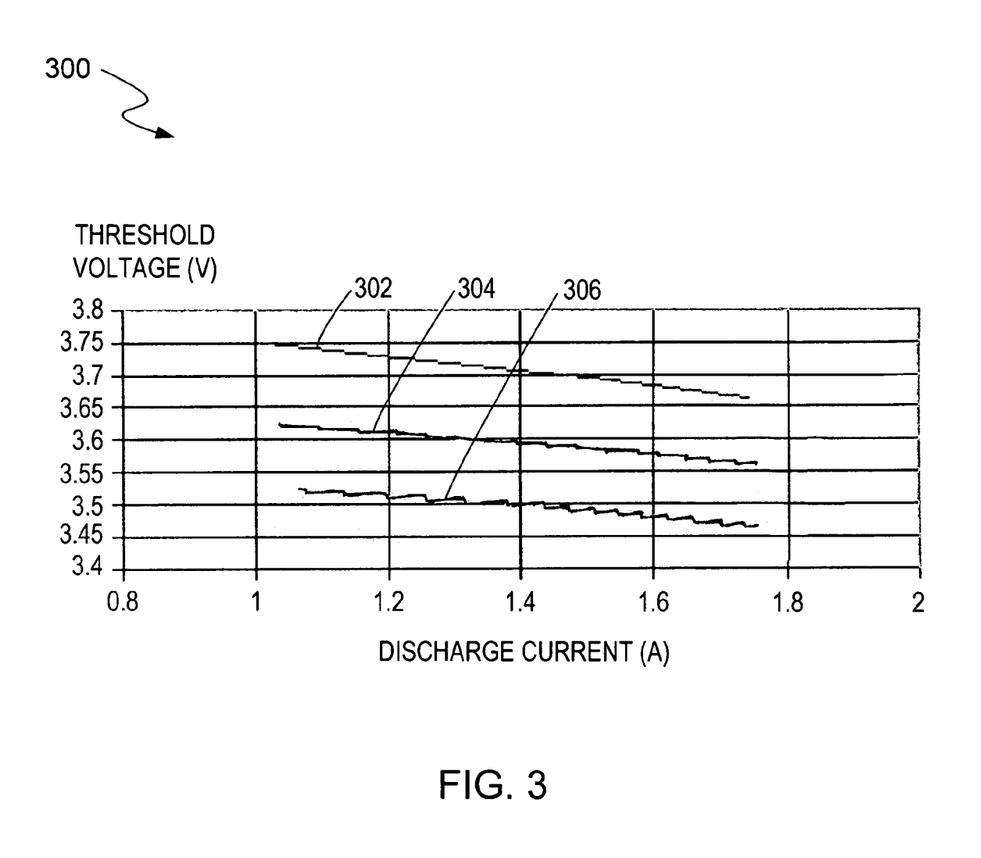
FIG. 3 is a schematic diagram of an exemplary relationship between the threshold voltage and the discharge current of the battery fuel gauge device in FIG. 1 consistent with the invention.

FIG. 3 is a schematic diagram of exemplary relationship between the threshold voltage and the discharge current of the battery fuel gauge device 100 in FIG. 1. Plots 302, 304, and 306 respectively show the relationship between the threshold voltage and the battery discharge current when the battery capacity is a constant, such as 75%, 50%, or 25%. In this embodiment, suppose the battery pack 120 is a Li-ion battery with 4000 mA/h whose ambient temperature is 25° C. Plot 302, 304, and 306 respectively illustrate the relationship of the threshold voltage and the discharge current when the output power of the Li-ion battery is 12.5 watts, 10 watts, or 7.5 watts. The threshold voltages are determined by the different discharge currents as shown by equations (1), (2), and (3), respectively. As shown in FIG. 3, when the discharge current of the Li-ion battery decreases in the discharge mode, the threshold voltage will increase accordingly.

$$V\_th\_75\% = 3.8636 - 0.1138 * Iout\ [V] \quad (1)$$

$$V\_th\_50\% = 3.7190 - 0.0902 * Iout\ [V] \quad (2)$$

$$V\_th\_25\% = 3.8636 - 0.0876 * Iout\ [V] \quad (3)$$

Wherein Iout is the discharge current of the Li-ion battery, and the above equations illustrate how to compute the threshold voltages when the ambient temperature of the Li-ion battery is 25° C. and the battery capacity is 75%, 50%, or 25%.

Those skilled in the art will appreciate that the relationship between the threshold voltage and the discharge current for the Li-ion battery is only for illustrative purpose. Those skilled in the art will also appreciate that the above-mentioned principle can be used for other types of battery. The description for the other types of battery will be omitted herein for clarity.

Figure 4:
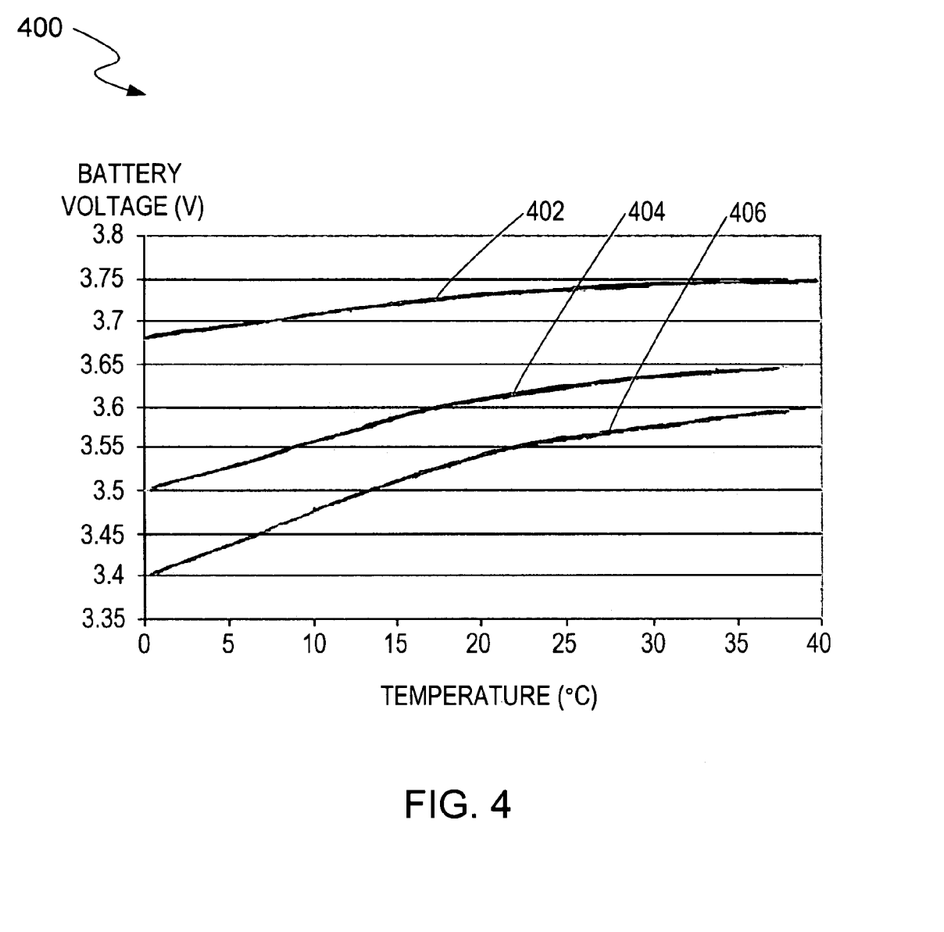
FIG. 4 is a schematic diagram of an exemplary relationship between the battery voltage and the temperature of the battery fuel gauge device in FIG. 1 consistent with the invention.

Turning to FIG. 4, a schematic diagram of exemplary relationship between the battery voltage and the temperature of the battery fuel gauge device 100 in FIG. 1 is depicted. Plots 402, 404, and 406 respectively illustrate the relationship between the battery voltage and the temperature when the battery capacity is 75%, 50%, or 25%. The battery voltage are determined by different temperatures when the battery capacity is respectively 75%, 50%, and 25% and the battery fuel gauge circuit 130 has different fixed threshold voltages given by equations (4), (5), and (6).

$$Vbatt\_m(75\%)=0.0017*T+3.6850 \ [V] \quad (4)$$

$$Vbatt\_m(50\%)=0.0037*T+3.5117 \ [V] \quad (5)$$

$$Vbatt\_m(25\%)=0.0005*T+3.4133 \ [V] \quad (6)$$

Wherein T is the battery temperature whose unit is ° C. 0.0017, 0.0037, and 0.005 are coefficients when the battery capacity is 75%, 50%, and 25%, respectively. 3.6850, 3.5117, and 3.4133 are threshold voltages when the battery capacity is 75%, 50%, and 25%.

The general equation can be given to show the relationship between the battery voltage and the temperature as equation (7).

$$Vbatt\_m=1/Km*T+V\_th\_m \ [V] \quad (7)$$

Wherein T is the battery temperature expressed in ° C., K is the ratio divider, m is the comparator index, Km is the ratio divider of the TA 134, V_th_m is the threshold voltage for the mth comparator before the battery temperature correction.

In the battery fuel gauge device 100, when the reference voltage is used for the discharge current correction and the battery temperature correction, the general equation for the threshold voltage then can be given by equation (8).

$$V\_th\_m=Vref*1/Bm-Io*1/Am+1/Km*T \ [V] \quad (8)$$

Wherein Am, Bm, and Km are coefficients generated by the coefficient generators to implement the discharge current correction and the battery temperature correction. Those skilled in the art will appreciate that the values of coefficients Am, Bm, and Km can vary according to the variance of the discharge current and the temperature so as to accurately predict the remaining capacity of the battery pack 120.

Though the relationship between the battery capacity and the battery voltage is represented in FIG. 2, those skilled in the art will appreciated that plots 202, 204, and 206 are only for illustrative purpose. Those skilled in the art will also appreciated that the relationship between the battery capacity and the battery voltage can vary accordingly when any relative features of the elements in the battery fuel gauge device 100 vary. Similar to FIG. 2, the plots shown in FIG. 3 and FIG. 4 can also vary according without departing from the spirit of the invention. Hence, the similar description of FIG. 3 and FIG. 4 will be omitted herein for clarity.

The battery fuel gauge circuit 130 can be utilized in various portable devices, for example, cell phones, laptop computers, digital cameras and PDAs. In these portable devices, the battery fuel gauge circuit 130 can measure the remaining charges in the power source, for example, the rechargeable battery pack 120. For clarity, only the description of one of the portable devices, i.e., a laptop computer is briefly illustrated herein.

The laptop computer typically includes a microcontroller, an input device (e.g., a keyboard) and a rechargeable battery (i.e., a power supply). When the laptop computer is used, for example, playing an audio file through activation the input device, the capacity of the rechargeable battery will decrease. In order to enable the user of the laptop computer to learn the remaining capacity, the above-mentioned battery fuel gauge circuit 130 can be used. The battery fuel gauge circuit 130 can be embedded into the rechargeable battery or be external to the rechargeable battery to measure its remaining capacity. The similar description of the function of the battery fuel gauge circuit 130 will be omitted herein for clarity.

When in use, the laptop computer can be configured with the microcontroller and/or corresponding software to indicate the remaining capacity of the rechargeable battery. In addition, the charger 110 can be activated by the user of the laptop computer to charge the rechargeable battery during measurement process.

In operation, the battery fuel gauge circuit 130 can implement discharge current correction and battery temperature correction in order to predict the remaining capacity of the battery pack 120 when the battery pack 120 is operating in the discharge mode. Many key parameters including the battery discharge current, the temperature and the battery voltage are important for prediction of the remaining capacity of the battery pack 120. In other word, any variance of the above-mentioned parameters can affect the capacity prediction. When the battery discharge current, the temperature or the battery voltage supplied by the battery pack 120 varies, a correction technique is needed to compensate the above variance.

In order to predict the capacity of the battery pack 120 accurately, the discharge current correction and the battery temperature correction are implemented by the battery fuel gauge circuit 130. When the discharge current varies, the variance of the discharge current can be sensed by the current sense amplifier 132, be corrected by the first plurality of coefficients, and then be respectively delivered to the plurality of adders as their first input signals. Similarly, when the ambient temperature of the battery pack 120 varies, the variance of temperature can be detected by the temperature amplifier 134, be corrected by the second plurality of coefficients, and then be respectively transmitted to the plurality of adders as their second input signals. A reference voltage is also need to implement the discharge current correction and the battery temperature correction. The reference voltage is corrected by the third plurality of coefficients and then be transferred to the plurality of adders as their third input signals. The plurality of adders can combine their three input signals and generate different threshold voltages.

The threshold voltage from the first, second, - - -, or Mth adder (i.e., the adder 162, the adder 164, - - -, or the adder 166) can be respectively delivered to the first, second, - - -, or Mth comparator (i.e., the comparator 162, the comparator 164, - - -, or the comparator 166) at its non-inverting input terminal. Each of the plurality of comparators can respectively compare the received threshold voltage with a reference voltage that is equal to the battery voltage divided by the total number of the battery cells included in the battery pack 120. After comparison, the plurality of comparators can generate a plurality of digital signals at their output terminals. The multiplexer 170 can receive the plurality of digital signals and then transfer them to the external indicating circuit that can display the capacity of the battery pack 120.

The embodiments that have been described herein, however, are but some of the several which utilize this invention and are set forth here by way of illustration but not of limitation. It is obvious that many other embodiments, which will be readily apparent to those skilled in the art, may be made without departing materially from the spirit and scope of the invention as defined in the appended claims. Furthermore, although elements of the invention may be described or claimed in the singular, the plural is contemplated unless limitation to the singular is explicitly stated.

What is claimed is:

1. A battery fuel gauge circuit for measuring a capacity of a rechargeable battery pack, the battery pack being capable of generating a battery voltage and a discharge current, the battery pack having a temperature, the battery fuel gauge circuit comprising:

an amplifier circuit capable of sensing the discharge current and the temperature of the battery pack and generating a first and a second voltage signals based upon the discharge current and the temperature;

a correction circuit capable of receiving the first and the second voltage signals and generating a plurality of voltages;

a plurality of comparators capable of receiving a reference voltage based upon the battery voltage, the plurality of comparator comparing the reference voltage with the plurality of voltages from the correction circuit and generating a plurality of digital signals; and a multiplexer capable of receiving the plurality of digital signals from the plurality of comparators, and controlling an external indicating circuit to indicate the capacity of the battery pack based upon the plurality of digital signals.

2. The battery fuel gauge circuit of claim 1, further comprising a sense resistor coupled to the battery pack, the sense resistor upon which the discharge current flowing through, and the sense resistor having a resistance.

3. The battery fuel gauge circuit of claim 2, wherein the amplifier circuit further comprising:

a first amplifier capable of receiving a voltage across the sense resistor, amplifying the voltage, and generating the first voltage signal, the voltage across the sense resistor being equal to the discharge current multiplied by the resistance of the sense resistor; and a second amplifier capable of receiving a voltage based upon the temperature of the battery pack, amplifying the voltage and generating the second voltage signal.

4. The battery fuel gauge circuit of claim 1, wherein the correction circuit further comprising:

a first plurality of coefficient generators capable of receiving the first voltage signal from the amplifier circuit and generating a first plurality of products through multiplying the first voltage signal by a first plurality of coefficients;

a second plurality of coefficient generators capable of receiving the second voltage signal from the amplifier circuit and generating a second plurality of products through multiplying the second voltage signal by a second plurality of coefficients;

a third plurality of coefficient generators capable of receiving a reference voltage and generating a third plurality of products through multiplying the reference voltage by a third plurality of coefficients; and a plurality of adders, each of the plurality of adders being capable of receiving one product from the first plurality of coefficient generators, one product from the second plurality of coefficient generators, and one product from the third plurality of coefficient generators and summing up the three products to generate a voltage.

5. An integrated circuit for measuring a battery capacity, comprising:

a battery pack capable of generating a discharge current and a battery voltage, the battery pack having a temperature;

a resistor upon which the discharge current flowing through;

a charger capable of charging the battery pack through the resistor;

an amplifier circuit capable of sensing the discharge current and the temperature of the battery pack and generating two voltage signals based upon the discharge current and the temperature;

a correction circuit capable of receiving the two voltage signals from the amplifier circuit and generating a plurality of voltages;

a plurality of comparators receiving a reference voltage based upon the battery voltage, the plurality of comparator comparing the reference voltage with the plurality of voltages from the correction circuit and generating a plurality of digital signals; and a multiplexer, the multiplexer being capable of receiving the plurality of digital signals from the plurality of comparators, and controlling an external indicating circuit representative of the battery fuel gauge of the battery pack based upon the plurality of digital signals.

6. The integrated circuit of claim 5, wherein battery pack including a plurality of battery cells.

7. The integrated circuit of claim 5, wherein the resistor being a sense resistor.

8. The integrated circuit of claim 5, wherein the amplifier circuit further comprising:

a first amplifier capable of receiving a voltage across the resistor, amplifying the voltage, and generating the first voltage signal, the voltage across the resistor being equal to the discharge current multiplied by the resistance of the resistor; and a second amplifier capable of receiving a voltage based upon the temperature of the battery pack, amplifying the voltage and generating the second voltage signal.

9. The integrated circuit of claim 5, wherein the correction circuit further comprising:

a first plurality of coefficient generators capable of receiving the first voltage signal from the amplifier circuit and generating a first plurality of products through multiplying the first voltage signal by a first plurality of coefficients;

a second plurality of coefficient generators capable of receiving the second voltage signal from the amplifier circuit and generating a second plurality of products through multiplying the second voltage signal by a second plurality of coefficients;

a third plurality of coefficient generators capable of receiving a reference voltage and generating a third plurality of products through multiplying the reference voltage by a third plurality of coefficients; and a plurality of adders, each of the plurality of adders being capable of receiving one product from the first plurality of coefficient generators, one product from the second plurality of coefficient generators, and one product from the third plurality of coefficient generators and adding up the three products to generate one of the plurality of voltages.

10. A portable computer comprising:
an input device for taking inputs from an user;
a microcontroller for performing operations based on the inputs from the user;
a power supply for supplying power to the portable computer; and
a battery fuel gauge circuit for measuring a remaining capacity of the power supply, the battery fuel gauge circuit including:

a battery pack capable of generating a discharge current and a battery voltage, the battery pack having a temperature;

a resistor upon which the discharge current flowing through;

a charger capable of charging the battery pack through the resistor;

an amplifier circuit capable of sensing the discharge current and the temperature of the battery pack and generating two voltage signals based upon the discharge current and the temperature;

a correction circuit capable of receiving the two voltage signals from the amplifier circuit and generating a plurality of voltages;

a plurality of comparators receiving a reference voltage based upon the battery voltage, the plurality of comparator comparing the reference voltage with the plurality of voltages from the correction circuit and generating a plurality of digital signals; and a multiplexer, the multiplexer being capable of receiving the plurality of digital signals from the plurality of comparators, and controlling an external indicating circuit representative of the battery fuel gauge of the battery pack based upon the plurality of digital signals.

11. The portable computer of claim 10, wherein battery pack including a plurality of battery cells.

12. The portable computer of claim 10, wherein the resistor being a sense resistor.

13. The portable computer of claim 10, wherein the amplifier circuit further comprising:

a first amplifier capable of receiving a voltage across the resistor, amplifying the voltage, and generating the first voltage signal, the voltage across the resistor being equal to the discharge current multiplied by the resistance of the resistor; and a second amplifier capable of receiving a voltage based upon the temperature of the battery pack, amplifying the voltage and generating the second voltage signal.

14. The portable computer of claim 10, wherein the correction circuit further comprising:

a first plurality of coefficient generators capable of receiving the first voltage signal from the amplifier circuit and generating a first plurality of products through multiplying the first voltage signal by a first plurality of coefficients;

a second plurality of coefficient generators capable of receiving the second voltage signal from the amplifier circuit and generating a second plurality of products through multiplying the second voltage signal by a second plurality of coefficients;

a third plurality of coefficient generators capable of receiving a reference voltage and generating a third plurality of products through multiplying the reference voltage by a third plurality of coefficients; and a plurality of adders, each of the plurality of adders being capable of receiving one product from the first plurality of coefficient generators, one product from the second plurality of coefficient generators, and one product from the third plurality of coefficient generators and adding up the three products to generate one of the plurality of voltages.

15. A method for measuring a capacity of a battery pack, comprising the steps of:

a) receiving a battery voltage from the battery pack;

b) generating a sense voltage based upon the battery voltage;

c) generating a temperature voltage indicative of a temperature of the battery pack;

d) receiving the sense voltage and the temperature voltage;

e) generating a plurality of threshold voltages according to the sense voltage and the temperature voltage;

f) comparing the plurality of threshold voltages with a reference voltage, the reference voltage being based upon the battery voltage;

g) generating a plurality of control signals based on results of the comparison; and h) controlling an external indicating circuit to display the capacity of the battery pack according to the plurality of the control signals.

16. The method of claim 15, wherein the step of b) further comprising:

generating a discharge current based upon the battery voltage; and converting the discharge current into the sense voltage.

17. The method of claim 15, wherein the step of d) further comprising:

multiplying the sense voltage by a first plurality of coefficients to generate a first plurality of products;

multiplying the voltage based upon the temperature of the battery pack by a second plurality of coefficients to generate a second plurality of products;

multiplying a reference voltage by a third plurality of coefficients to generate a third plurality of products; and adding up the first plurality of products, the second plurality of products, and the third plurality of products respectively.

* * * * *